US012580529B2

(12) United States Patent
Schultz et al.

(10) Patent No.: US 12,580,529 B2
(45) Date of Patent: Mar. 17, 2026

(54) HARMONIC TRAP FILTER WITH NON-UNIFORM RESONANCE FREQUENCY DISTRIBUTION

(71) Applicant: NXP USA, Inc., Austin, TX (US)

(72) Inventors: Joseph Gerard Schultz, Wheaton, IL (US); Kevin Kim, Chandler, AZ (US); Jeffrey Kevin Jones, Chandler, AZ (US); Vikas Shilimkar, Chandler, AZ (US); Olivier Lembeye, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 481 days.

(21) Appl. No.: 18/176,208

(22) Filed: Feb. 28, 2023

(65) Prior Publication Data

US 2023/0361726 A1      Nov. 9, 2023

(30) Foreign Application Priority Data

May 4, 2022     (EP) ...................................... 22305664

(51) Int. Cl.
*H03F 3/19* (2006.01)
*H03H 7/01* (2006.01)
(52) U.S. Cl.
CPC ............. *H03F 3/19* (2013.01); *H03H 7/0138* (2013.01); *H03F 2200/165* (2013.01); *H03F 2200/171* (2013.01); *H03F 2200/222* (2013.01); *H03F 2200/387* (2013.01); *H03F 2200/451* (2013.01); *H03H 2007/013* (2013.01)

(58) Field of Classification Search
CPC ... H03H 7/0138; H03H 3/19; H03H 2007/013
USPC ..................................................... 333/175, 176
See application file for complete search history.

(56) References Cited

U.S. PATENT DOCUMENTS 9,923,526 B1      3/2018   Lembeye

OTHER PUBLICATIONS

Bond-wire Engineering to improve performance in multi-cell GaN packaged devices Subrata Halder, John McMacken, Dave Runton of RFMD IEEE 2013.
Peter H. Aaen; Multi-physics modeling of high-power microwave transistors 2012 IEEE/MTT-S International Microwave Symposium Jun. 17-22, 2012.

*Primary Examiner* — Rakesh B Patel
(74) *Attorney, Agent, or Firm* — Andrew C. Milhollin

(57) ABSTRACT

An RF amplifier includes at least one harmonic trap filter with an array of shunt filter legs having a non-uniform resonance frequency distribution. The harmonic trap filter is configured to suppress frequencies in a suppression frequency range that includes harmonic frequencies of carrier frequencies in a range of carrier frequencies. Each of the shunt filter legs includes a capacitor and inductor coupled in series, and an intermediate node coupled between the capacitor and the inductor. Each intermediate node of the shunt filter leg is coupled to at least one other intermediate node of another shunt filter leg of the filter with a dampening resistor. Shunt filters at or near edges of the array are configured to have lower resonance frequencies than those at or near the center of the array to suppress excess current flow at edges of the RF amplifier.

15 Claims, 10 Drawing Sheets

HARMONIC TRAP FILTER WITH NON-UNIFORM RESONANCE FREQUENCY DISTRIBUTION

CROSS-REFERENCE TO RELATED APPLICATIONS

This application claims the priority under 35 U.S.C. § 119 of European patent application no. 22305664.9, filed on May 4, 2022 the contents of which are incorporated by reference herein.

TECHNICAL FIELD

Embodiments of the subject matter described herein relate generally to RF amplifiers and more specifically to harmonic trap filters for RF amplifiers.

BACKGROUND

Radio frequency (RF) amplifiers utilize harmonic filters to block harmonic frequencies (e.g., the second harmonic frequency) of the fundamental frequency of the input signal that is to be amplified. Typically, an input signal includes a fundamental carrier signal that oscillates at the fundamental frequency and multiple harmonics that are superimposed on the fundamental carrier signal and that oscillate at harmonic frequencies of the fundamental frequency. While the amplitudes of such harmonics are typically small relative to the amplitude of the carrier frequency, they can distort the waveform of the input signal. Harmonic filters are included at inputs or outputs of RF amplifiers to mitigate such harmonic distortion.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an amplifier package includes a harmonic trap filter that includes an array of shunt filter legs, and a transistor die coupled to the harmonic trap filter. A first set of shunt filter legs of the array of shunt filter legs near edges of the array of shunt filter legs may have first resonance frequencies that are lower than second resonance frequencies of a second set of shunt filter legs of the array of shunt filter legs near a center of the array of shunt filter legs. The transistor die may include at least one transistor.

In one or more embodiments, each shunt filter leg of the array of shunt filter legs includes an inductor, a capacitor coupled in series with the inductor, and an intermediate node coupled between the inductor and the capacitor.

In one or more embodiments, each shunt filter leg of the array of shunt filter legs is coupled between a respective input node of a plurality of input nodes and a ground potential node, and the plurality of input nodes is coupled to the transistor die.

In one or more embodiments, the amplifier package includes a first plurality of resistors. Each of the first plurality of resistors may be coupled between a respective pair of intermediate nodes of adjacent shunt filter legs of the array of shunt filter legs.

In one or more embodiments, the amplifier package includes a second plurality of resistors. Each of the second plurality of resistors may be coupled between a respective pair of adjacent input nodes of the plurality of input nodes.

In one or more embodiments, the array of shunt filter legs includes a plurality of inductors, each having similar inductance values, and a plurality of capacitors. A first set of capacitors of the plurality of capacitors may have first capacitance values that are greater than capacitance values of a second set of capacitors of the plurality of capacitors. The first set of capacitors may be disposed near the edges of the array of shunt filter legs and the second set of capacitors may be disposed near the center of the array of shunt filter legs.

In one or more embodiments, the array of shunt filter legs includes a plurality of capacitors, each having similar capacitance values, and a plurality of inductors. A first set of inductors of the plurality of inductors may have first inductance values that are greater than inductance values of a second set of inductors of the plurality of inductors. The first set of inductors may be disposed near the edges of the array of shunt filter legs, and the second set of inductors may be disposed near the center of the array of shunt filter legs.

In an example embodiment, a harmonic trap filter includes an array of series LC filters arranged in parallel between a plurality of input nodes and a ground potential node. A first set of series LC filters of the array of series LC filters near edges of the array of series LC filters may have first resonance frequencies that are lower than a second set of series LC filters of the array of series LC filters near a center of the array of series LC filters.

In one or more embodiments, the harmonic trap filter includes odd-mode resistors. Each of the odd-mode resistors may be coupled between adjacent input nodes of the plurality of input nodes.

In one or more embodiments, the harmonic trap filter may include dampening resistors. Each of the dampening resistors may be coupled between intermediate nodes of adjacent series LC filters of the array of series LC filters, and each of the intermediate nodes may be coupled between a capacitor and an inductor of a corresponding series LC filter of the array of series LC filters.

In one or more embodiments, the array of series LC filters may include a plurality of inductors, each having similar inductance values, and a plurality of capacitors. A first set of capacitors of the plurality of capacitors may have first capacitance values that are greater than capacitance values of a second set of capacitors of the plurality of capacitors. The first set of capacitors may be disposed near the edges of the array of series LC filters and the second set of capacitors may be disposed near the center of the array of series LC filters.

In one or more embodiments, the array of series LC filters includes a plurality of capacitors, each having similar capacitance values, and a plurality of inductors. A first set of inductors of the plurality of inductors may have first inductance values that are greater than inductance values of a second set of inductors of the plurality of inductors. The first set of inductors may be disposed near the edges of the array of series LC filters and the second set of inductors may be disposed near the center of the array of series LC filters.

In an example embodiment, a radio frequency (RF) amplifier includes a transistor die having at least one transistor device having a control terminal and an input harmonic trap filter coupled to the control terminal of the at least one transistor device. The input harmonic trap filter may include an array of shunt filter legs having a non-uniform resonance frequency distribution. The array of shunt filter legs may include first shunt filter legs with lower resonance frequencies near edges of the array of shunt filter legs and second shunt filter legs with higher resonance frequencies near the center of the array of shunt filter legs.

In one or more embodiments, each shunt filter leg of the array of shunt filter legs includes an inductor, a capacitor coupled in series with the inductor, and an intermediate node coupled between the inductor and the capacitor.

In one or more embodiments, the input harmonic trap filter includes a plurality of input nodes, and the array of shunt filter legs is coupled between the plurality of input nodes and a ground potential node.

In one or more embodiments, the input harmonic trap filter includes a plurality of dampening resistors coupled between intermediate nodes of adjacent shunt filter legs of the array of shunt filter legs.

In one or more embodiments, the input harmonic trap filter includes a plurality of odd-mode resistors coupled between adjacent input nodes of the plurality of input nodes. The plurality of odd-mode resistors may be configured to suppress odd-mode oscillations of the RF amplifier.

In one or more embodiments, the array of shunt filter legs includes a plurality of inductors, each having similar inductance values; and a plurality of capacitors. A first set of capacitors of the plurality of capacitors may have first capacitance values that are greater than capacitance values of a second set of capacitors of the plurality of capacitors. The first set of capacitors may be disposed near the edges of the array of shunt filter legs and the second set of capacitors may be disposed near the center of the array of shunt filter legs.

In one or more embodiments, the array of shunt filter legs includes a plurality of capacitors, each having similar capacitance values, and a plurality of inductors. A first set of inductors of the plurality of inductors may have first inductance values that are greater than inductance values of a second set of inductors of the plurality of inductors. The first set of inductors may be disposed near the edges of the array of shunt filter legs and the second set of inductors may be disposed near the center of the array of shunt filter legs.

In one or more embodiments, the RF amplifier may include an output harmonic trap filter coupled to an output of the at least one transistor device, the output harmonic trap filter having a non-uniform resonance frequency distribution.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
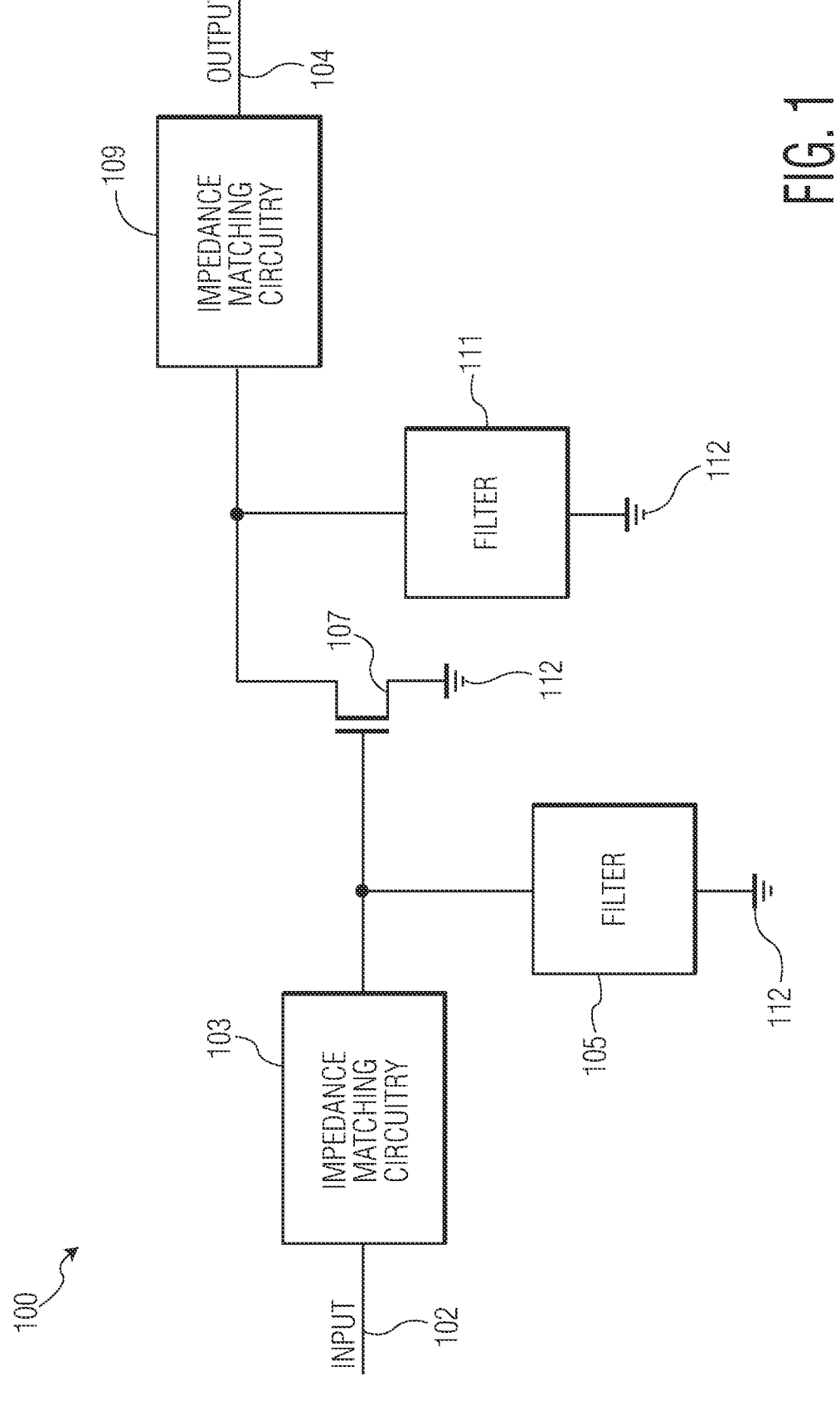
FIG. 1 is a block diagram of an example radio frequency (RF) amplifier according to an embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

As disclosed herein, a radio frequency (RF) amplifier includes at least one harmonic trap filter with a plurality of shunt filter legs. Herein, a "shunt filter leg" may refer to a path between an amplifier input and ground, where one or more inductive, capacitive, and/or resistive elements included in the shunt filter leg or coupled to the shunt filter leg form a filter (e.g., a bandpass filter configured to pass at least a portion of signal power of signals in a defined frequency range to ground, while preventing most or all signal power from signals outside of the defined frequency range from passing to ground). The harmonic trap filter may be coupled between an input of the RF amplifier and ground, for example. The harmonic trap filter may be configured to suppress frequencies in a suppression frequency range (sometimes referred to as the "overall suppression frequency range", which may differ from the individual suppression frequency ranges of the individual shunt filter legs), which includes at least one harmonic frequency of a carrier frequency in a range of fundamental carrier frequencies. Each of the shunt filter legs may include a capacitor, an inductor, and an intermediate node coupled between the capacitor and inductor. The intermediate node of each shunt filter leg of the harmonic trap filter is coupled to at least one other intermediate node of another shunt filter leg of the harmonic trap filter with a resistive element (e.g., a resistor, sometimes referred to herein as a "dampening resistor" or a "de-Qing resistor"). Such dampening resistors may equalize the response of the harmonic trap filter across the suppression frequency range to provide for a smoother response across the entire range, for example. In one or more embodiments, the input node of each shunt filter leg of the harmonic trap filter is coupled to at least one other input node of another shunt filter leg of the harmonic trap filter with a resistive element (e.g., a resistor, sometimes referred to herein as an "odd-mode resistor"). Such odd-mode resistors may suppress odd-mode oscillations caused by asymmetries in operations of parallel transistors of the RF amplifier, for example. Each shunt filter leg is configured to suppress frequencies in a respective suppression frequency range that includes a harmonic (e.g., 2nd harmonic) of a carrier frequency in a range of fundamental carrier frequencies (sometimes referred to as the "carrier passband"). Each suppression frequency range has a center frequency (e.g., corresponding to the resonance frequency of the corresponding shunt filter leg). The suppression frequency range may differ between at least some of the shunt filter legs of the harmonic trap filter, due at least in part to such shunt filter legs having respectively different resonance frequencies. For example, capacitance and/or inductance values may differ between two or more of the shunt filter legs of the harmonic trap filter, resulting in respectively different resonant frequencies and different suppression frequency ranges for the different shunt filter legs. The suppression frequency ranges of each shunt filter leg each contribute to the overall suppression frequency range of the harmonic trap filter. By providing a harmonic trap filter that includes multiple shunt filter legs, the overall suppression frequency range of the harmonic trap filter may be wider compared to harmonic trap filter s that include only a single shunt filter leg. By including dampening resistors between intermediate nodes of the shunt filter legs, the overall suppression frequency range of the harmonic trap filter may be further widened.

In one or more embodiments, the harmonic trap filter may include shunt filter legs having a non-uniform distribution of resonance frequencies (and a corresponding non-uniform distribution of frequency responses). That is, not all of the shunt filter legs of the harmonic trap filter s have the same respective resonance frequencies and frequency responses. By providing shunt filter legs with varying resonance frequencies, rather than configuring each shunt filter leg to have the same resonance frequency, parallel resonances and distortions (e.g., caused by mutual inductances and non-idealities of bond-wires included in the shunt filter legs) in the harmonic trap filter that would otherwise negatively impact performance of the RF amplifier may be mitigated.

Generally, RF amplifiers that include multiple transistors arranged in parallel have non-uniform input drive currents. For example, given an array of parallel signal paths coupled to an input of such an RF amplifier, the signal paths at or near outer edges of the array of signal paths experience higher current flow (e.g., around twice as much current flow) than signal paths near the center of the array. In one or more embodiments, a non-uniform distribution of shunt filter leg resonance frequencies may be implemented, such that shunt filter legs coupled to signal paths at or near the center of the array of signal paths may be configured to have higher resonance frequencies than shunt filter legs that are coupled to signal paths at or near the outer edges of the array of signal paths. In such embodiments, the shunt filter legs coupled to signal paths at the outer edges of the array of signal paths have a greater suppressive effect on current flow through those signal paths, compared to that of the shunt filter legs coupled to signal paths at or near the center of the array, due to their comparatively lower resonance frequencies. This suppression of current flow at the edges of the array of signal paths coupled to the RF amplifier may mitigate the non-uniformity of the input drive (e.g., input power drive) through the RF amplifier. Thus, in addition to mitigating parallel resonances and distortions caused by mutual inductances and non-idealities of bond-wires, as discussed above, by providing shunt filter legs with lower resonance frequencies coupled to signal paths at outer edges of the array of signal paths and shunt filter legs with higher frequencies coupled to signal paths at or near the center of the array, input drive uniformity of the RF amplifier may be improved.

FIG. 1 shows a circuit diagram of an RF amplifier 100 according to one embodiment of the present invention. The RF amplifier 100 includes an input 102 configured to receive a lower power signal that is typically modulated at a carrier frequency (sometimes referred to as the "fundamental frequency" of the input signal) and an output 104 that provides an amplified version of the input signal that is amplified to have increased power. The amplified version of the input signal is sometimes referred to as the "output signal" or the "amplified signal" herein. The RF amplifier 100 includes transistor device 107 that provides amplification of the input signal. In one or more embodiments, the transistor device 107 is implemented with a single transistor with a control terminal (e.g., gate) coupled to receive the input signal and two current terminals (e.g., a source and drain). One of the current terminals (e.g., the drain) of the transistor device 107 is configured to provide the output signal. The other current terminal (e.g., the source) of the transistor device 107 is coupled to a ground potential node 112 (sometimes referred to as "ground voltage 112", "ground 112", or "ground potential 112"). In some other embodiments, transistor device 107 may be implemented with multiple transistors connected in parallel, with each of the multiple transistors amplifying a portion of the input signal. In one or more embodiments, the transistors are characterized as laterally diffused metal-oxide-semiconductor (LDMOS) field-effect transistors (FETs). In some other embodiments, the transistors may be characterized as bipolar transistors (e.g., bipolar junction transistors (BJTs)), metal-semiconductor field-effect transistors (MESFETs), heterojunction bipolar transistors (HBTs), or high electron mobility transistors (HEMTs). In one or more embodiments, the transistors can include silicon (e.g., as with a silicon LDMOS FET or a silicon bipolar transistor), a III-V material such as gallium arsenide (GaAs) (e.g., as with a GaAs MESFET), indium gallium phosphide (InGaP) (e.g., as with an InGaP HBT), or gallium nitride (GaN) (e.g., as with a GaN HEMT or GaN bipolar transistor).

In one or more embodiments, an information signal to be transmitted with the input signal may be modulated at a predefined carrier frequency such as with a power amplifier for a cellular transmitter. In other embodiments, no information is modulated within the carrier frequency (as with a RF heater device). In one or more embodiments, the carrier frequency is in the range of 500 MHz to 7500 MHz. According to various examples, the carrier frequency is in the range of 1800 MHz-2200 MHz or in the range of 2300 MHz-2700 MHz. In some other embodiments, the carrier frequency may be at other frequencies such as at or around 77 GHz.

The RF amplifier 100 may include a number of filters configured to block out or reject unwanted frequencies, such as impedance matching circuitry 103, impedance matching circuitry 109, filter 105, and filter 111. The impedance matching circuitry 103 is coupled between the input 102 and at least one gate terminal of the transistor device 107. The impedance matching circuitry 103 may include an in-line filter designed to block out frequencies outside a desired frequency band prior to amplification. The impedance matching circuitry 103 may also be configured to provide input impedance matching between the input 102 (e.g., a signal source coupled to the input 102) and the transistor device 107.

The impedance matching circuitry 109 may be coupled between an output of the transistor device 107 (e.g., at least one drain terminal of the transistor device 107) and the output 104. The impedance matching circuitry 109 may include an in-line filter that blocks unwanted frequencies at the output of the transistor device 107. The impedance matching circuitry 109 may also perform output impedance matching between the transistor device 107 and the output 104.

The filters 105 and 111 may include harmonic trap filters configured to block harmonics of the carrier frequency of the input signal. The filters 105 and 111 are sometimes referred to as "harmonic trap filter 105" and "harmonic trap filter 111". In some embodiments, in addition to the harmonic trap filters, one or both of the filters 105 and 111 may include one or more circuits coupled to the ground 112 and configured to provide impedance matching in combination with the impedance matching circuitry 109. The filter 105 is coupled between the gate of the transistor device 107 and the ground 112. The filter 111 is coupled between the drain of the transistor device 107 and the ground 112. The filters 105 and 111 are configured to block or reject harmonic frequencies (e.g., the second harmonic frequency) of the carrier frequency of the input signal for a range of fundamental carrier frequencies by providing a low impedance (e.g., short) path to ground for those frequencies. The respective range of frequencies blocked or rejected (i.e., suppressed) by each of the filters 105 and 111 is sometimes referred to as the "overall suppression frequency range" of the corresponding filter. As will be described, either or both of the filters 105 and 111 may include multiple parallel shunt filter legs having intermediate nodes coupled to one another by dampening resistors. Herein, a "shunt filter leg" refers to a path between a signal path of an amplifier, such as the RF amplifier 100, and ground (e.g., the ground 112), where one or more inductive, capacitive, and/or resistive elements are included in the shunt filter leg or coupled to the shunt filter leg to form a filter (e.g., a bandpass filter configured to pass at least a portion of signal power of signals in a defined frequency, such as the overall suppression frequency range, range to ground, while preventing most or all signal power from signals outside of the defined frequency range from passing to ground).

In one or more embodiments, a shunt filter leg may be a series LC filter that includes an inductor and a capacitor coupled in series between an input node and ground, and an array of shunt filter legs may include a parallel array of such series LC filters. In one or more embodiments, the filters 105 and 111 are configured to block second harmonics (e.g., two times the carrier frequency) of the carrier frequency of the input signal. Additional harmonics (e.g., third harmonics, fourth harmonics, etc.) of the carrier frequency may be blocked by either or both of the filters 105 and 111 in some other embodiments. In one or more embodiments, either or both of the filter 105 and the filter 111 include an arrangement of shunt filter legs having a non-uniform distribution of resonance frequencies (e.g., with at least two of the shunt filter legs having respectively different resonance frequencies and suppression frequency ranges).

In one or more embodiments, an array of signal paths (including one or more corresponding arrays of bond-wires, for example) are provided between the impedance matching circuitry 103 and the control terminal(s) of the transistor device 107, with each signal path of the array being coupled to a respectively different shunt filter legs of the filter 105. In some such embodiments, shunt filter legs with lower resonance frequencies may be coupled to signal paths at extreme positions in the array of signal paths (e.g., at or near outer edges of the array) and shunt filter legs with higher resonance frequencies may be coupled to signal paths at central positions in the array (e.g., at or near the center of the array). Such an arrangement of shunt filter legs with a non-uniform resonance frequency distribution may advantageously improve the uniformity of the input drive through the transistor device 107.

Figure 2:
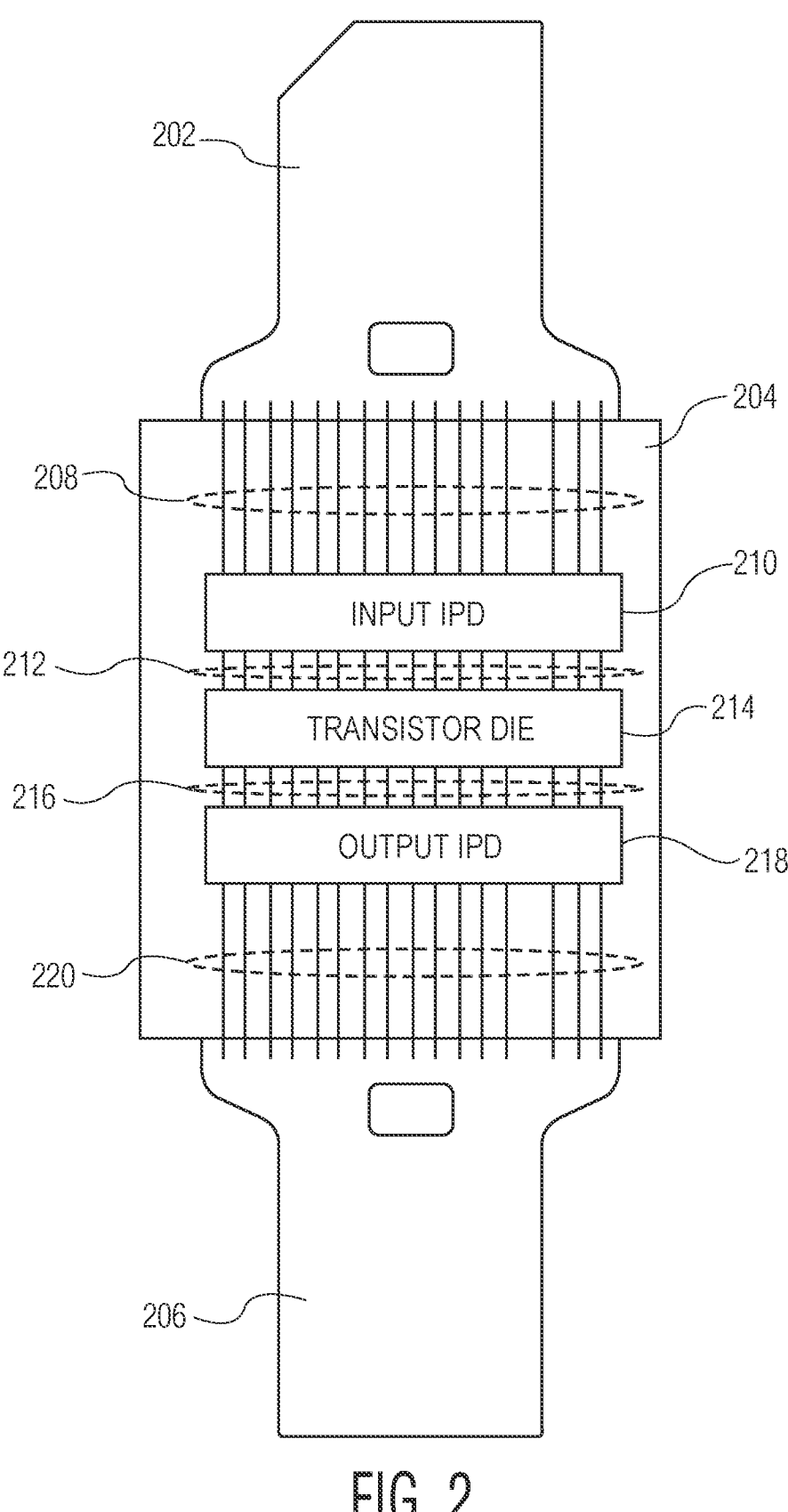
FIG. 2 is a top view of an example amplifier package that includes an RF amplifier, such as the RF amplifier of FIG. 1 according to an embodiment.

FIG. 2 shows a top-down view of an illustrative amplifier package 200 that includes an RF amplifier with an input harmonic trap filter having an array of shunt filter legs with a non-uniform resonance frequency distribution. The amplifier package 200 may include an implementation of the RF amplifier 100 of FIG. 1, for example. The amplifier package 200 includes an input conductor 202 (sometimes referred to as a gate conductor 202), a ground-plane substrate 204, bond-wire arrays 208, 212, 216, 220, an input integrated passive die (IPD) 210, a transistor die 214, an output IPD 218, and an output conductor 206 (sometimes referred to as a drain conductor 206).

The input conductor 202 is coupled to the input IPD 210 via the bond-wire array 208. The input IPD 210 is coupled to the transistor die 214 via the bond-wire array 212. The transistor die 214 is coupled to the output IPD 218 via the bond-wire array 216. The output IPD is coupled to the output conductor 206 via the bond-wire array 220.

The ground-plane substrate 204 may be formed from a conductive portion of a housing of the amplifier package 200. The input IPD 210, the transistor die 214, and the output IPD 218 may each be disposed on the ground-plane substrate 204 and may each be electrically coupled to the ground-plane substrate 204. For example, the ground-plane substrate 204 may provide the ground potential (e.g., ground potential 112 of FIG. 1) for each of the input IPD 210, the transistor die 214, and the output IPD 218.

The input conductor 202 may act as an input (e.g., the input 102 of FIG. 1) of the RF amplifier of the amplifier package 200 and may be coupled to an RF signal source. The output conductor 206 may act as an output (e.g., the output 104 of FIG. 1) of the RF amplifier of the amplifier package 200 and may be coupled to a load. The input IPD 210 may include integrated components (e.g., capacitors, resistors, through-substrate vias (TSVs), and the like) that, together with at least a portion of the bond-wires of the bond-wire array 208 and the bond-wire array 212, form impedance matching circuitry (e.g., the impedance matching circuitry 103 of FIG. 1) and/or an input harmonic trap filter (e.g., the filter 105 of FIG. 1). The output IPD 218 may include integrated components (e.g., capacitors, resistors, TSVs, and the like) that, together with at least a portion of the bond-wires of the bond-wire array 216 and the bond-wire array 220, form impedance matching circuitry (e.g., the impedance matching circuitry 109 of FIG. 1) and/or an output harmonic trap filter (e.g., the filter 111 of FIG. 1). The transistor die 214 may include a transistor device (e.g., the transistor device 107 of FIG. 1), which may include an array of transistors arranged in parallel (around 32 parallel transistors, according to one or more embodiments). Each of the parallel transistors of the transistor die 214 may include a control terminal (e.g., a gate terminal) coupled to the input conductor 202 via the input IPD and the bond-wire arrays 208 and 212, a first current terminal (e.g., a source terminal) coupled to the ground-plane substrate 204 (e.g., by one or more TSVs formed in the transistor die 214), and a second current terminal (e.g., a drain terminal) coupled to the output conductor 206 via the bond-wire arrays 216 and 220 and the output IPD 218. In one or more embodiments, the transistors of the transistor die 214 are characterized as LDMOS FETS. In some other embodiments, the transistors may be characterized as BJTs, MESFETs, HBTs, or HEMTs. In one or more embodiments, the transistors can include silicon (e.g., as with a silicon LDMOS FET or a silicon bipolar transistor), a III-V material such as GaAs (e.g., as with a GaAs MESFET), InGaP (e.g., as with an InGaP HBT), or GaN (e.g., as with a GaN HEMT or GaN bipolar transistor).

The input IPD 210 may include a silicon die. The input IPD 210, in combination with at least some bond-wires of the arrays of bond-wire arrays 208 and 212, may form a low pass L-C-L input match configured to provide an input match between the transistor die 214 and the signal source coupled to the input conductor 202. The input IPD 210 and at least some bond-wires of the bond-wire array 212 form a harmonic trap filter (e.g., the harmonic trap filter 400 of FIG. 4) configured to provide a relatively low impedance path to ground for signals at frequencies within a suppression frequency range (sometimes referred to as the "overall suppression frequency range" of the harmonic trap filter).

In one or more embodiments, the output IPD 218 additionally or alternatively includes a similar harmonic trap filter (e.g., as part of the filter 111 of FIG. 1). In one or more embodiments, dampening resistors (e.g., dampening resistors 410 of FIG. 4) may be omitted from the harmonic filter when implemented at the output of the amplifier (e.g., as part of the output IPD 218) for noise mitigation.

As will be described, the harmonic trap filter may include an array of shunt filter legs, each configured to provide a relatively low impedance path to ground for signals at frequencies within a respective suppression frequency range, each contributing to the overall suppression frequency range of the harmonic trap filter. The shunt filter legs may be LC series resonant traps, each having a respective resonance frequency, and the array of shunt filter legs may have a non-uniform distribution of resonance frequencies.

In one or more embodiments, odd-mode resistors (e.g., odd-mode resistors 346, 404 of FIGS. 3, 4) are coupled between inputs of adjacent shunt filter legs. These odd-mode resistors are configured to suppress odd-mode oscillations caused be the arrangement of transistors in parallel on the transistor die 214.

In one or more embodiments, dampening resistors (e.g., dampening resistors 334, 410, FIGS. 3, 4) are coupled between intermediate nodes of adjacent shunt filter legs (e.g., nodes between the capacitor and inductor of each shunt filter leg) of the harmonic trap filter. These dampening resistors may improve the uniformity of the quality factor across the overall suppression frequency range of the harmonic trap filter by reducing the frequency dependence of the impedance of the harmonic trap filter (e.g., desensitizing the harmonic trap filter to variations in frequency). The dampening resistors may reduce or prevent parallel resonances between shunt filter legs of the array and may reduce the sensitivity of the shunt filter legs to non-idealities due to mutual inductances between bond-wires or variations in bond-wire shape.

Figure 3:
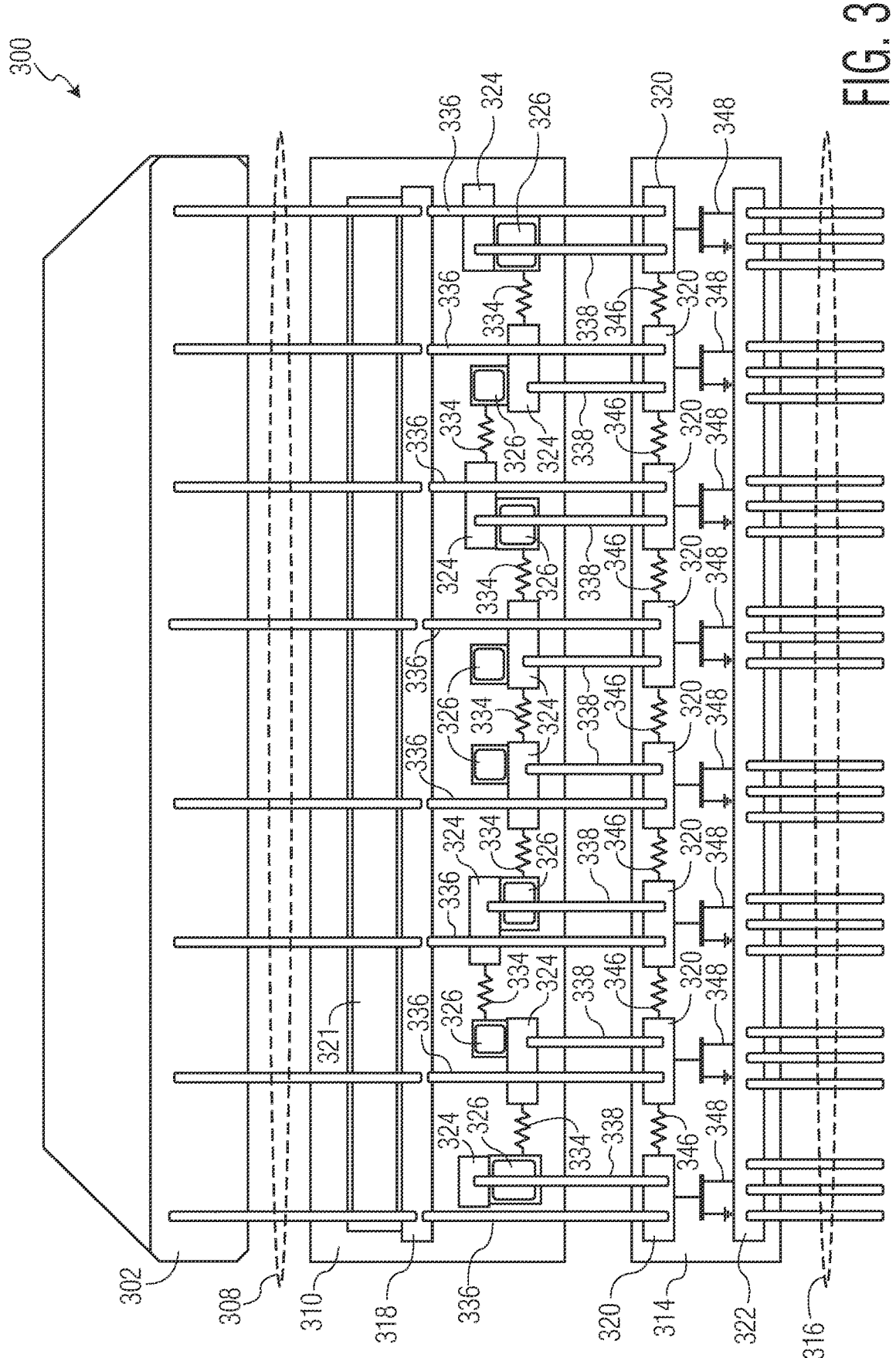
FIG. 3 is a partial top view of an example amplifier package, such as the amplifier package of FIG. 2, that includes an integrated passive device (TPD) and a transistor die according to an embodiment.

FIG. 3 shows an example partial top view of an amplifier package 300 (e.g., a portion of the amplifier package 200 of FIG. 2). The amplifier package 300 includes an input conductor 302 (e.g., the input conductor 202 of FIG. 2), a bond-wire array 308 (e.g., the bond-wire array 208 of FIG. 2), an input IPD 310 (e.g., the input IPD 210 of FIG. 2), an transistor die 314 (e.g., the transistor die 214 of FIG. 2), a bond-wire array 316 (e.g., the bond-wire array 216 of FIG. 2), and bond-wire arrays 336 and 338 (e.g., collectively the bond-wire array 212 of FIG. 2).

The input IPD 310 includes a bond pad 318, a capacitor 321, bond pads 324, capacitors 326, and dampening resistors 334. The transistor die includes bond pads 320, a bond pad 322, odd-mode resistors 346, and an array of transistor device 348. The bond-wire array 308 couples the input conductor 302 to the bond pad 318 of the input IPD 310. The bond-wire array 336 couples the bond pad 318 to the bond pads 320 of the transistor die 314. The bond-wire array 338 couples the bond pads 320 of the transistor die 314 to the bond pads 324 of the input IPD 310. The bond-wire array 316 couples the bond pad 322 to an output conductor (e.g., the output conductor 206 of FIG. 2) of the amplifier package 300 directly or via an intervening output IPD (e.g., the output IPD 218 of FIG. 2), according to various embodiments.

The capacitor 321 may be coupled between the bond pad 318 and a ground potential (e.g., the ground potential 112 of FIG. 1; the ground-plane substrate 204 of FIG. 1) of the amplifier package 300. The bond-wire array 308, the capacitor 321, and the bond-wire array 336 provide an L-C-L input matching circuit configured to reduce an impedance mismatch between the transistor devices 348 and the signal source coupled to the input conductor 302.

Each of the transistor devices 348 may include multiple transistors arranged in parallel, with control terminals (e.g., gates) of the transistors coupled to the bond pads 320, first current terminals (e.g., source terminals) of the transistors coupled to a ground potential (e.g., ground potential 112 of FIG. 1; ground-plane substrate 204 of FIG. 2), and second current terminals (e.g., drain terminals) of the transistors coupled to the bond pad 322. The second current terminals of the transistors of the transistor devices 348 are sometimes referred to herein as "output terminals" or "outputs" of such transistors. In one or more embodiments, each of the eight transistor devices 348 includes eight respective transistors for a total of 64 parallel transistors included on the transistor die 314, though more or fewer transistors may be provided on the transistor die 314 according to various other embodiments. In one or more embodiments, the transistor devices 348 collectively form an RF amplifier configured to output a peak power of around 600 W, with each of the transistor of the transistor devices 348 configure to output between around 0.5 W to around 1 W of peak power. The RF amplifier may be configured to operate at one or more of 1.8 GHz, 2.6 GHz, 3.7 GHz, and 8 GHz frequency bands. In an embodiment, the transistor die 314 is around 30 mm in length, with each of the transistor devices 348 corresponding to a segment of the transistor die that is around 3.75 mm in length. In various other embodiments, the transistor die 314 includes more transistor devices than the eight transistor devices 348 of the present example and is greater than 30 mm in length (e.g., 80 mm).

The odd-mode resistors 346 are coupled between adjacent bond pads of the bond pads 320. These odd-mode resistors 346 are configured to suppress odd-mode oscillations caused by parallel arrangement of the transistors of the transistor devices 348 (e.g., due to asymmetries in the operations of the transistors and corresponding harmonics).

The bond-wire array 338 couples the bond pads 320 of the transistor die 314 to the bond pads 324 of the input IPD 310. The capacitors 326 are coupled between the bond pads 320 and a ground potential (e.g., the ground potential 112 of FIG. 1; the ground-plane substrate 204 of FIG. 2). For example, the capacitors 326 may be coupled to the ground potential by respective TSVs that extend through the substrate of the input IPD 310. The capacitors 326 may be metal-insulator-metal (MIM) capacitors, for example.

The bond-wire array 338 and the capacitors 326 may, together, form shunt filter legs of an input harmonic trap filter coupled to the control terminals (e.g., gate terminals) of the transistor devices 348. The harmonic trap filter may be configured (based on capacitance values of the capacitors 326 and inductance values of the bond-wires of the bond-wire array 338) to suppress frequencies in a suppression frequency range that includes harmonics (e.g., the second harmonic) of the carrier frequency of the RF amplifier. The shunt filter legs of the harmonic trap filter may be arranged as a parallel array of shunt filter legs, with each shunt filter leg including a respective bond-wire of the bond-wire array 338 and a respective capacitor of the capacitors 326 connected in series. Each shunt filter leg has a respective resonance frequency, and the array of shunt filter legs may have a non-uniform distribution of resonance frequencies. The distribution of resonance frequencies across the array of shunt filter legs may be non-uniform. The resonance frequencies of shunt filter legs at or near the center of the array of shunt filter legs may be higher than the resonance frequencies of the shunt filter legs at or near the edges of the array (i.e., at edges of the harmonic trap filter). For example, the distribution of resonance frequencies may be: [0.46*Fr, 0.82*Fr, Fr, Fr, Fr, Fr, 0.82*Fr, 0.46*Fr], where Fr represents twice the center frequency of the fundamental frequency band of the amplifier. In an example embodiment, Fr is around 5.033 GHz, given a fundamental passband of around 2.516 GHz.

The resonance frequency of a given shunt filter leg is dependent on the inductance of its bond-wire and the capacitance of its capacitor (e.g., where the resonance frequency corresponds to $1/(\sqrt(LC))$, where L is the inductance of the bond-wire and C is the capacitance of the capacitor). Thus, the resonant frequencies of different shunt filter legs may be varied by varying the respective capacitances of the capacitors 326, the respective inductances of the bond-wires of the bond-wire array 338, or both. In one or more embodiments, the inductances of the bond-wires of the bond-wire array 338 may be substantially the same (e.g., all within around 5% of one another, not accounting for non-idealities in bond-wire shape) and at least some of the capacitors 326 may have respectively different capacitances to achieve the non-uniform resonance frequency distribution across (e.g., with capacitance values of capacitors in the shunt filter legs at or near the edges of the array of shunt filter legs (i.e., at edges of the harmonic trap filter) being greater than those of capacitors in the shunt filter legs at or near the center of the array of shunt filter legs). In other embodiments, the capacitances of the capacitors 326 may be substantially the same (e.g., all within around 5% of one another) and at least some of the bond-wires of the bond-wire array 338 may have respectively different inductances to achieve the non-uniform resonance frequency distribution across (e.g., with inductance values of bond-wires in the shunt filter legs at or near the edges of the array of shunt filter legs being greater than those of bond-wires in the shunt filter legs at or near the center of the array of shunt filter legs). In still other embodiments, both capacitance values of the capacitors 326 and inductance values of the bond-wires of the bond-wire array 338 may differ between two or more of the shunt-filter legs to achieve the desired non-uniform resonance frequency distribution.

Distributed effects across the transistor die 314 may cause higher current flow through signal paths at edges of the transistor die 314 (e.g., corresponding also to shunt filter legs at edges of the array of shunt filter legs). By providing shunt filter legs with higher resonance frequencies at or near the center of the shunt filter array (i.e., at or near the center of the harmonic trap filter) and shunt filter legs with lower resonance frequencies at the edges of the shunt filter array (i.e., at or near the center of the harmonic trap filter), uniformity of the input drive through the RF amplifier may be improved, which may improve RF amplifier performance.

The dampening resistors 334 are coupled between intermediate nodes of adjacent shunt filter legs (e.g., nodes between the capacitor and inductor of each shunt filter leg) of the harmonic trap filter. According to various embodiments, these intermediate nodes may correspond to upper plates of the capacitors 326, the bond pads 324, or (as shown in the present example) a combination of these. These dampening resistors may improve the uniformity of the quality factor across the overall suppression frequency range of the harmonic trap filter by reducing the frequency dependence of the impedance of the harmonic trap filter. The dampening resistors may reduce or prevent parallel resonances between shunt filter legs of the array and may reduce the sensitivity of the shunt filter legs to non-idealities due to mutual inductances between bond-wires or variations in bond-wire shape.

Figure 4:
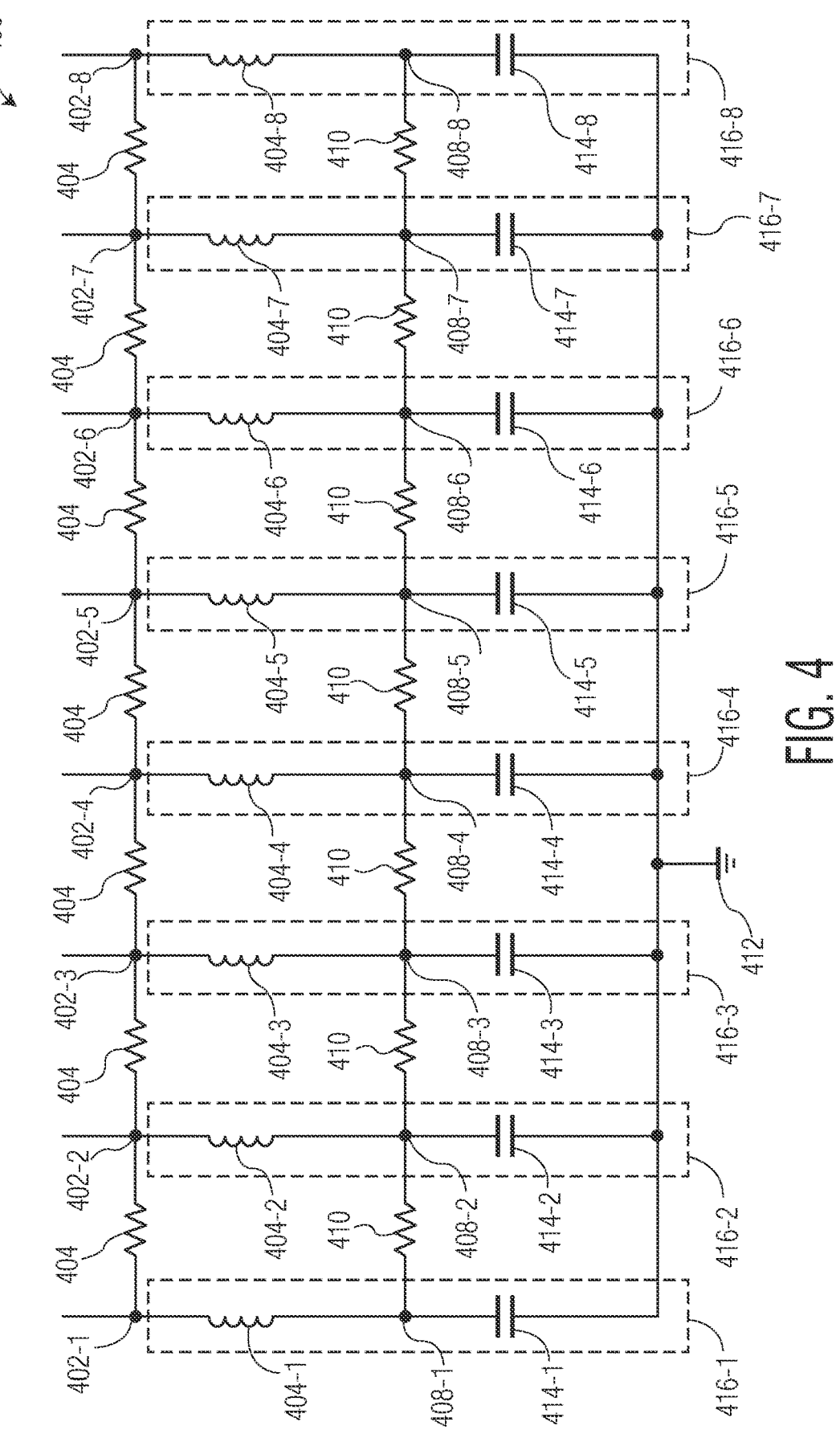
FIG. 4 is a circuit diagram of an example harmonic trap filter according to an embodiment.

FIG. 4 shows an example circuit diagram of a harmonic trap filter 400 that includes an array of shunt filter legs 416 (sometimes referred to as series LC filters 416) having a non-uniform resonance frequency distribution. In one or more embodiments, the harmonic trap filter 400 may correspond to an input harmonic trap filter for an RF amplifier, such as an embodiment of the input harmonic trap filter implemented by the bond-wire array 338, capacitors 326, and dampening resistors 334 of the amplifier package 300 of FIG. 3. In one or more embodiments, the harmonic trap filter 400 may correspond to an output harmonic trap filter (e.g., the filter 111 of FIG. 1) coupled to an output of a transistor die, such as the transistor die 314 of FIG. 3. The harmonic trap filter 400 may odd-mode resistors 404 (e.g., the odd-mode resistors 346 of FIG. 3), inductors 406 (e.g., the bond-wires of the bond-wire array 338 of FIG. 3), capacitors 414 (e.g., the capacitors 326 of FIG. 3), and dampening resistors 410 (e.g., the dampening resistors 334 of FIG. 3).

Each of the shunt filter legs 416 includes an inductor of the inductors 406 and a capacitor of the capacitors 414 both coupled in series between a respective input node of input nodes 402 and a ground potential 412 (e.g., the ground potential 112 of FIG. 1; the ground-plane substrate 204 of FIG. 2). Each of the shunt filter legs 416 is coupled to one or more adjacent shunt filter legs 416 of the array via one or more dampening resistors 410. Each dampening resistor 410 is coupled between intermediate nodes 408 of two adjacent shunt filter legs 416. Each of the intermediate nodes 408 is coupled between the inductor 406 and the capacitor 414 of its respective shunt filter leg 416. The odd-mode resistors 404 are each coupled between adjacent input nodes of the input nodes 402. Each of the input nodes 402 may be coupled to one or more control terminals (e.g., gates) of one or more transistors (e.g., the transistor devices 348 of FIG. 3) of an RF amplifier.

Each of the shunt filters 416 is configured to have a respective resonance frequency, with at least two of the shunt filters 416 having different resonance frequencies, such that the array of the shunt filters 416 has a non-uniform distribution of resonance frequencies. The resonance frequencies of the shunt filter legs 416 at or near the center of the array (e.g., the shunt filter legs 416-3, 416-4, 416-5, 416-6) may be higher than the resonance frequencies of the shunt filter legs at or near the edges of the array (e.g., the shunt filter legs 416-1, 416-2, 416-7, 416-8). For example, the distribution of resonance frequencies may be: [0.46*Fr, 0.82*Fr, Fr, Fr, Fr, Fr, 0.82*Fr, 0.46*Fr], where Fr represents twice the center frequency of the fundamental frequency band of the amplifier. In an example embodiment, Fr is around 5.033 GHz, given a fundamental passband of around 2.516 GHz.

The resonance frequency of a given shunt filter leg 416 is dependent on the inductance of its inductor 406 and the capacitance of its capacitor 414 (e.g., where the resonance frequency corresponds to $1/(\sqrt{(LC)})$, where L is the inductance of the inductor and C is the capacitance of its capacitor). Thus, the resonant frequencies of different shunt filter legs of the shunt filter legs 416 may be varied by varying the respective capacitances of the capacitors 326, the respective inductances of the inductors 406, or both. In one or more embodiments, the inductances of the inductors 406 may all be substantially the same (e.g., all within around 5% of one another, not accounting for non-idealities in bond-wire shape) and at least some of the capacitors 414 may have respectively different capacitances to achieve the non-uniform resonance frequency distribution across (e.g., with capacitance values of capacitors in the shunt filter legs at or near the edges of the array of shunt filter legs being greater than those of capacitors in the shunt filter legs at or near the center of the array of shunt filter legs). In other embodiments, the capacitances of the capacitors 414 may all be substantially the same (e.g., all within around 5% of one another) and at least some of the inductors 406 may have respectively different inductances to achieve the non-uniform resonance frequency distribution across (e.g., with inductance values of inductors in the shunt filter legs at or near the edges of the array of shunt filter legs being greater than those of inductors in the shunt filter legs at or near the center of the array of shunt filter legs). In still other embodiments, both capacitance values of the capacitors 414 and inductance values of the inductors 406 may differ between two or more of the shunt-filter legs to achieve the desired non-uniform resonance frequency distribution.

The odd-mode resistors 404 are coupled between adjacent input nodes 402 of the harmonic trap filter 400 These odd-mode resistors 404 are configured to suppress odd-mode oscillations caused by parallel arrangement of the transistors of the RF amplifier to which the harmonic trap filter 400 is coupled (e.g., due to asymmetries in the operations of the transistors and corresponding harmonics), in one or more embodiments.

The dampening resistors 410 are coupled between intermediate nodes 408 of adjacent shunt filter legs of the shunt filter legs 416 of the harmonic trap filter 400. These dampening resistors 410 may improve the uniformity of the quality factor across the overall suppression frequency range of the harmonic trap filter 400 by reducing the frequency dependence of the impedance of the harmonic trap filter 400.

The dampening resistors 410 may be configured to reduce or prevent parallel resonances between shunt filter legs 416 and may reduce the sensitivity of the shunt filter legs 416 to non-idealities due to mutual inductances between the inductors 406 or, in one or more embodiments, variations in bond-wire shape of the bond-wires that may form the inductors 406. In this way, the dampening resistors 410 may improve the bandwidth of the suppression frequency range of the harmonic trap filter 400.

Figure 5:
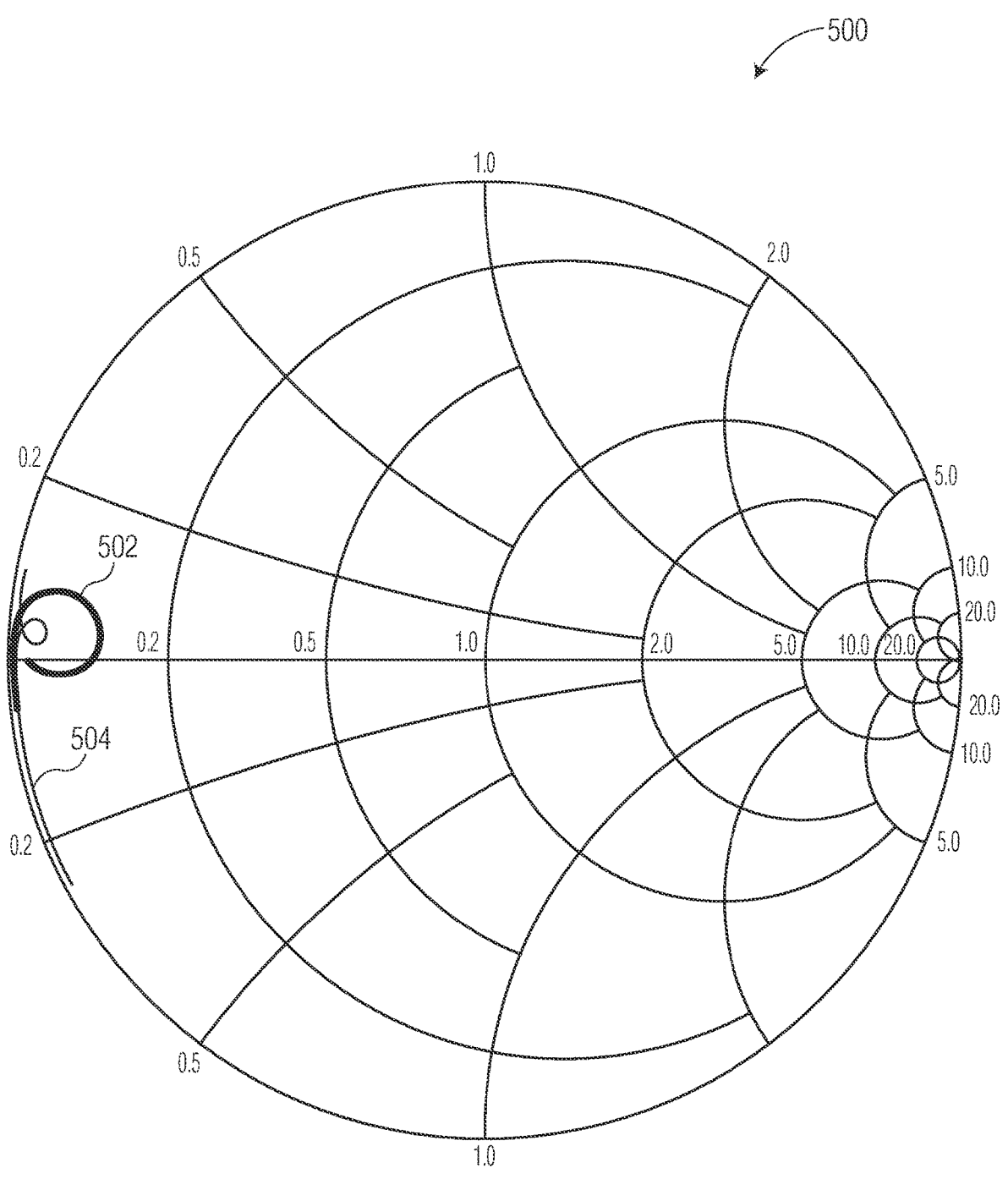
FIG. 5 is a Smith chart showing an example input reflection coefficient for two overlapping frequency bands for a harmonic trap filter having a uniform frequency response.
Figure 6:
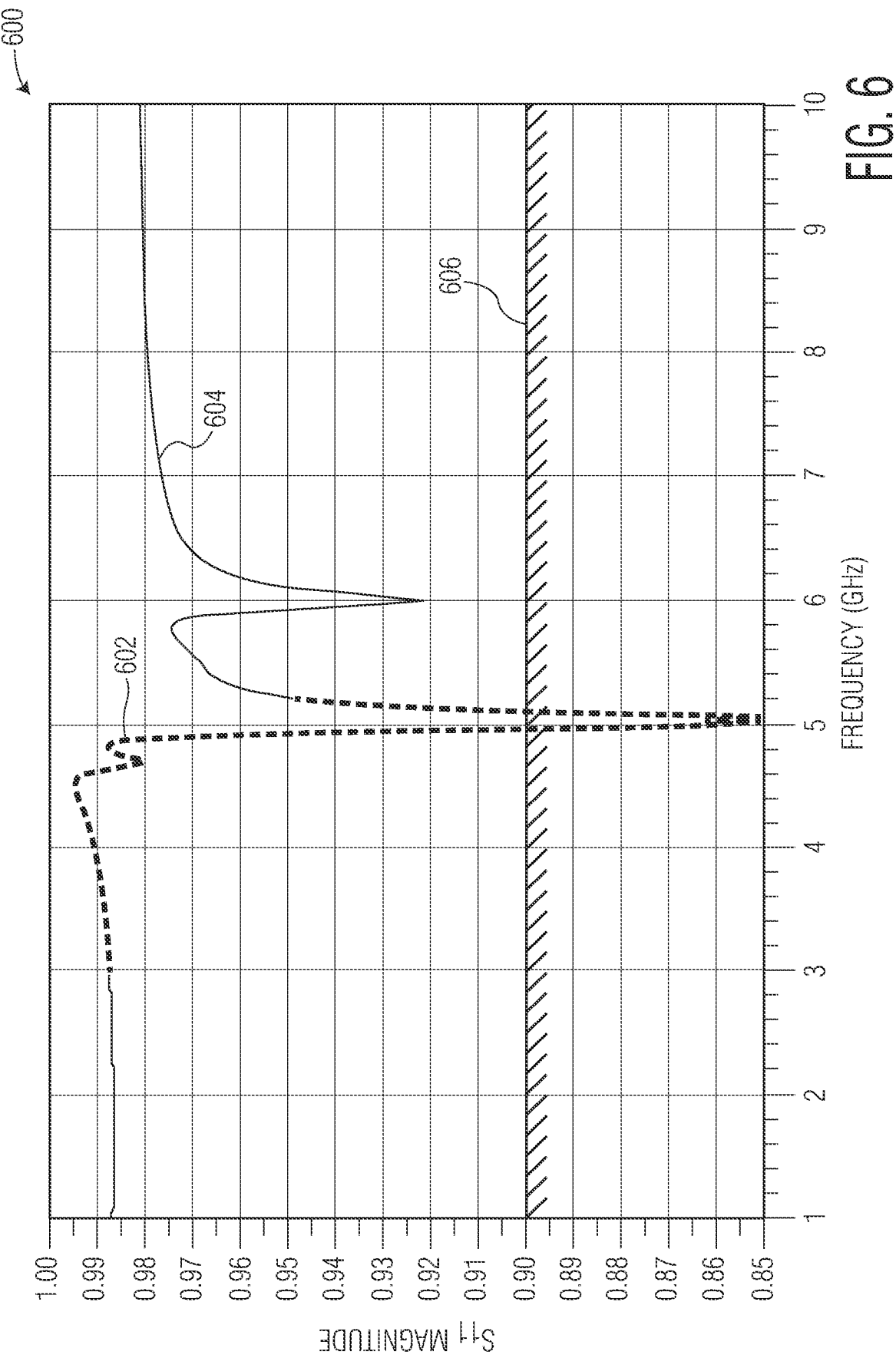
FIG. 6 is a chart showing the input reflection coefficient magnitude versus frequency for two overlapping frequency bands for a harmonic trap filter having a uniform frequency response.
Figure 7:
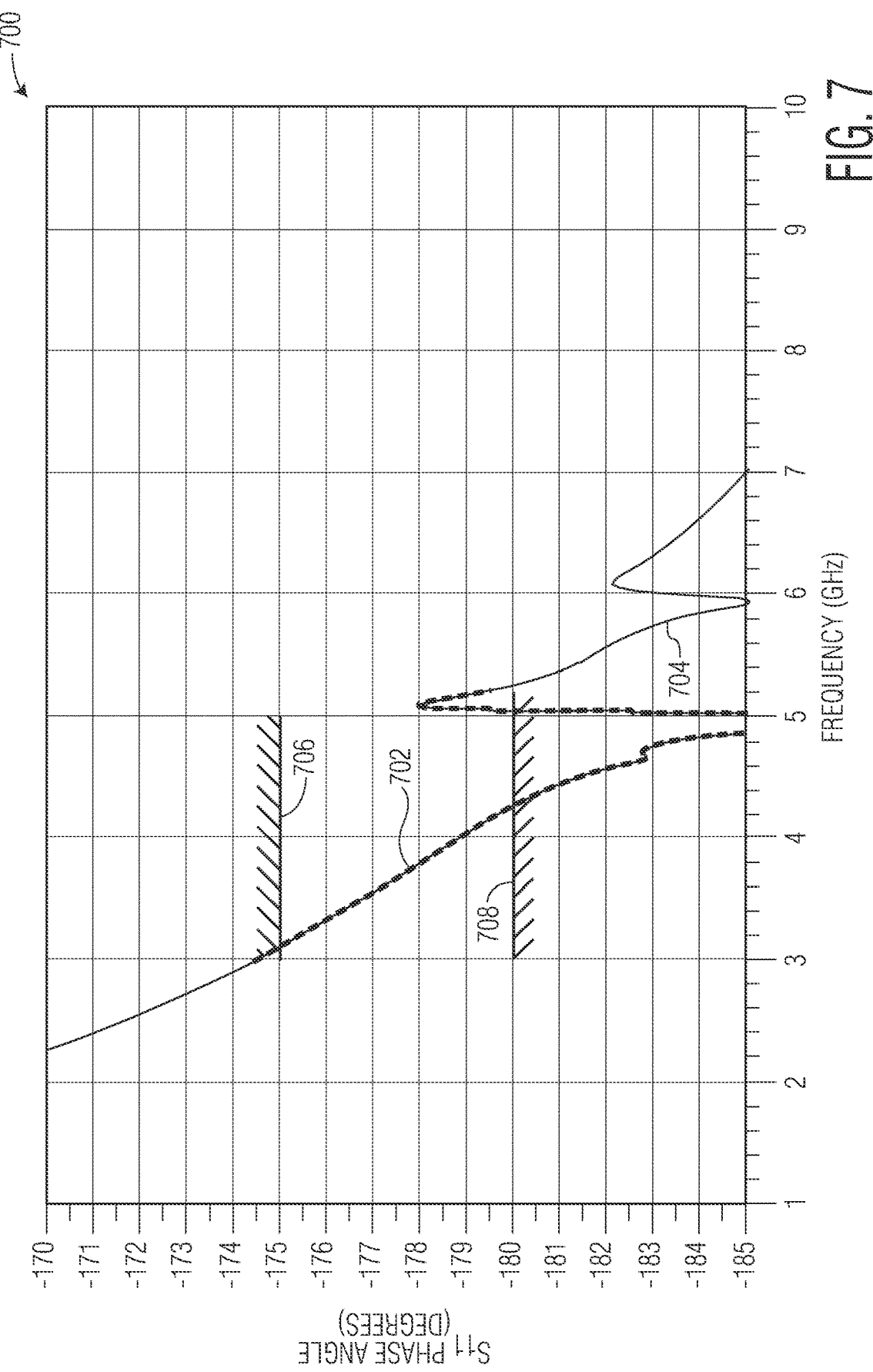
FIG. 7 is a chart showing the input reflection coefficient phase versus frequency for two overlapping frequency bands for a harmonic trap filter having a uniform frequency response.

FIGS. 5-7 show aspects of the input reflection coefficient (i.e., the Sn parameter) of a harmonic trap filter of an RF amplifier over different frequency ranges. The harmonic trap filter includes an array of shunt filter legs configured to have uniform resonance frequency distribution under ideal conditions. For example, the harmonic trap filter may include an array of eight shunt filter legs, with each of the shunt filter legs being configured to have the same resonance frequency under ideal conditions. The charts of FIGS. 5-7, in representing respective characteristics of the harmonic trap filter, take into account non-idealities, such as the mutual inductance between bond-wires and non-idealities (e.g., shape variation) in bond-wires of the harmonic trap filter. As will be described, these non-idealities, may negatively impact RF amplifier performance (e.g., due to corresponding parallel resonances between shunt filter legs and/or $S_{11}$ parameter magnitudes and phases angles of certain frequencies falling outside of a desirable range).

FIG. 5 shows a Smith chart 500 illustrating $S_{11}$ parameter for a harmonic trap filter having a uniform frequency response. The values of the harmonic trap filter over a first curve 502, corresponding to a first frequency range, and a second curve 504, corresponding to a second frequency range. In the present example, the first frequency range is from 3 GHz to 5.2 GHz and the second frequency range is from 1 GHz to 10 GHz. The first frequency range may correspond to a desired suppression frequency range for the harmonic trap filter. Due at least in part to the array of shunt filter legs of the harmonic trap filter being configured to have a uniform resonance frequency distribution under ideal conditions in combination with mutual inductances between bond-wires of the harmonic trap filter and non-idealities of those bond-wires, parallel resonances occur between shunt filter legs of the harmonic trap filter. These parallel resonances cause loops in the curves 502 and 504, which are indicative of degraded performance of the RF amplifier.

FIG. 6 shows a chart 600 illustrating $S_{11}$ parameter magnitude versus frequency over the first and second frequency ranges corresponding to the Smith chart 500 of FIG. 5. A first curve 602 corresponds to the first frequency range (3 GHz to 5.2 GHz) and a second curve 604 corresponds to the second frequency range (1 GHz to 10 GHz). A magnitude threshold 606 (corresponding to a $S_{11}$ magnitude of 0.90) is shown, corresponding to a threshold under which the magnitude of the $S_{11}$ parameter may be undesirable. For example, frequencies at which the Sn parameter magnitude is less than the magnitude threshold 606 are not sufficiently suppressed by the harmonic trap filter, resulting in second harmonics at these frequencies potentially negatively impacting performance of the RF amplifier. In the present example, frequencies between around 5 GHz and around 5.1 GHz correspond to Sn parameter magnitudes that fall below the magnitude threshold 606 due, at least in part, to the array of shunt filter legs of the harmonic trap filter being configured to have a uniform resonance frequency distribution under ideal conditions in combination with non-idealities caused by mutual inductance between bond-wires and non-ideal bond-wires shapes.

FIG. 7 shows a chart 700 illustrating $S_{11}$ parameter phase angle versus frequency over the first and second frequency ranges corresponding to the Smith chart 500 of FIG. 5. A first curve 702 corresponds to the first frequency range (3 GHz to 5.2 GHz) and a second curve 704 corresponds to the second frequency range (1 GHz to 10 GHz, though some of these frequencies fall outside of the range of phase angles shown in the present example). A first phase angle threshold 706 (around –175 degrees) and a second phase angle threshold 708 (around –180 degrees) are shown, corresponding, respectively, to upper and lower phase angle thresholds. In one or more embodiments, it is desirable for the $S_{11}$ parameter phase angle to be within a range between the first and second phase angle thresholds 706 and 708, and frequencies corresponding to $S_{11}$ parameter phase angles outside of this range may negatively impact performance of the RF amplifier, since the impedance through the harmonic trap filter is not sufficiently low outside of this range. In the present example, frequencies below around 3.2 GHz, between around 4.2 GHz and around 5 GHz, and above around 5.2 GHz correspond to $S_{11}$ parameter phase angles that fall outside of the range between the first and second phase angle thresholds 706 and 708 due, at least in part, to the array of shunt filter legs of the harmonic trap filter being configured to have a uniform resonance frequency distribution under ideal conditions in combination with non-idealities caused by mutual inductance between bond-wires and non-ideal bond-wires shapes. Thus, only a relatively small bandwidth (around 1 GHz) between 3.2 GHz and 4.2 GHz is suppressed by the harmonic trap filter.

Figure 8:
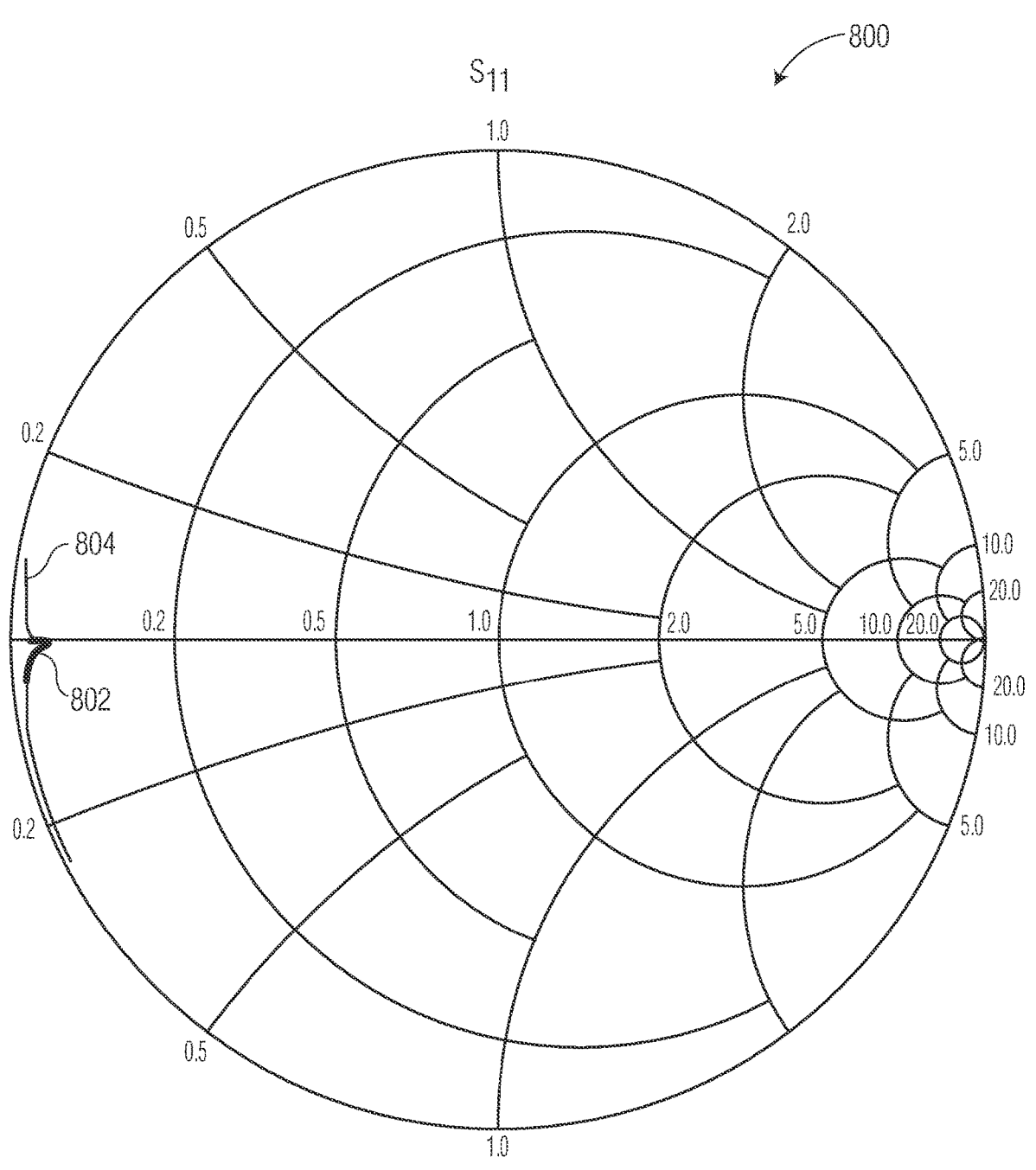
FIG. 8 is a Smith chart showing an example input reflection coefficient for two overlapping frequency bands for a harmonic trap filter has a non-uniform frequency response according to an embodiment.
Figure 9:
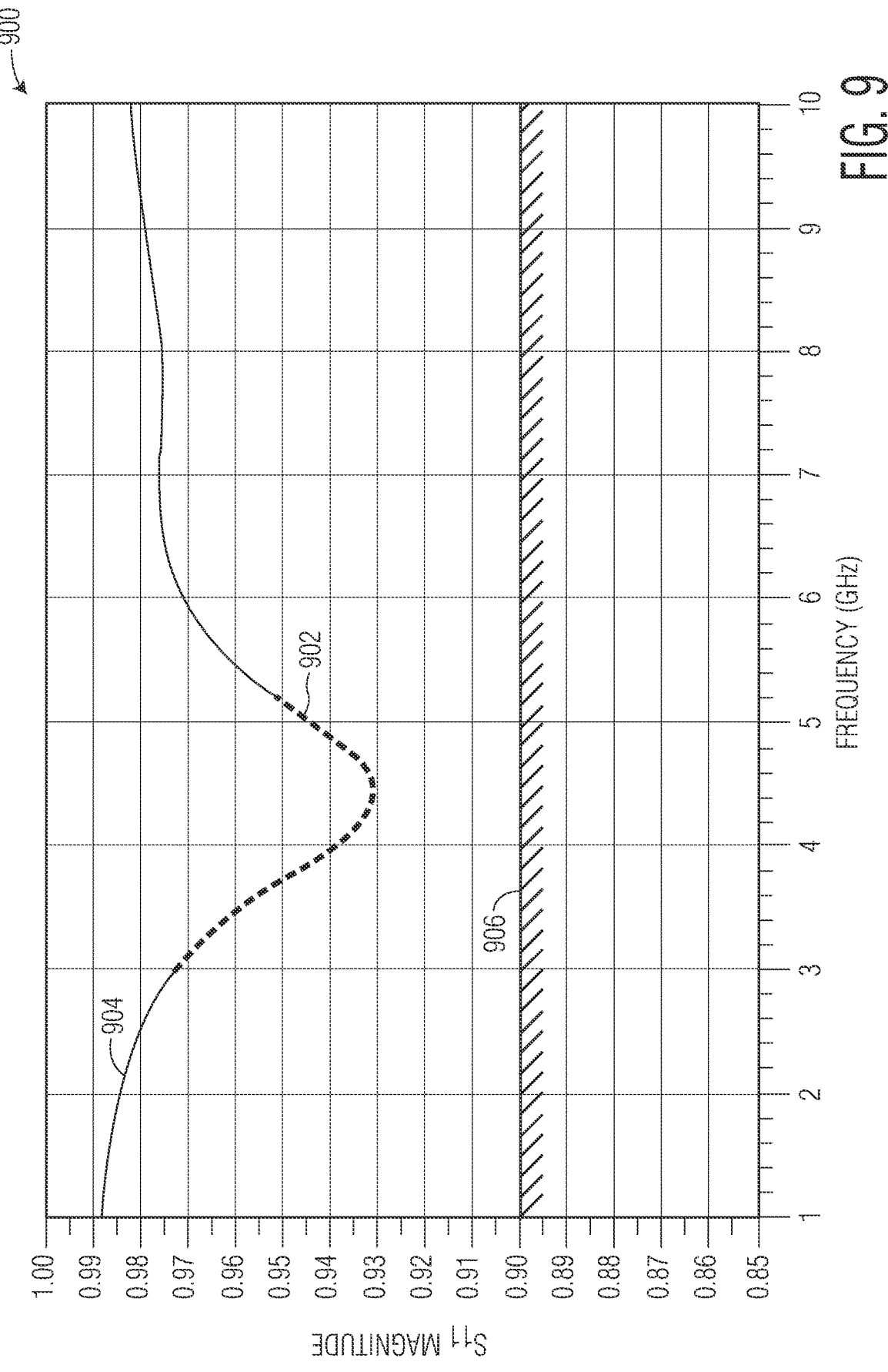
FIG. 9 is a chart showing the input reflection coefficient magnitude versus frequency for two overlapping frequency bands for a harmonic trap filter having a non-uniform frequency response according to an embodiment.
Figure 10:
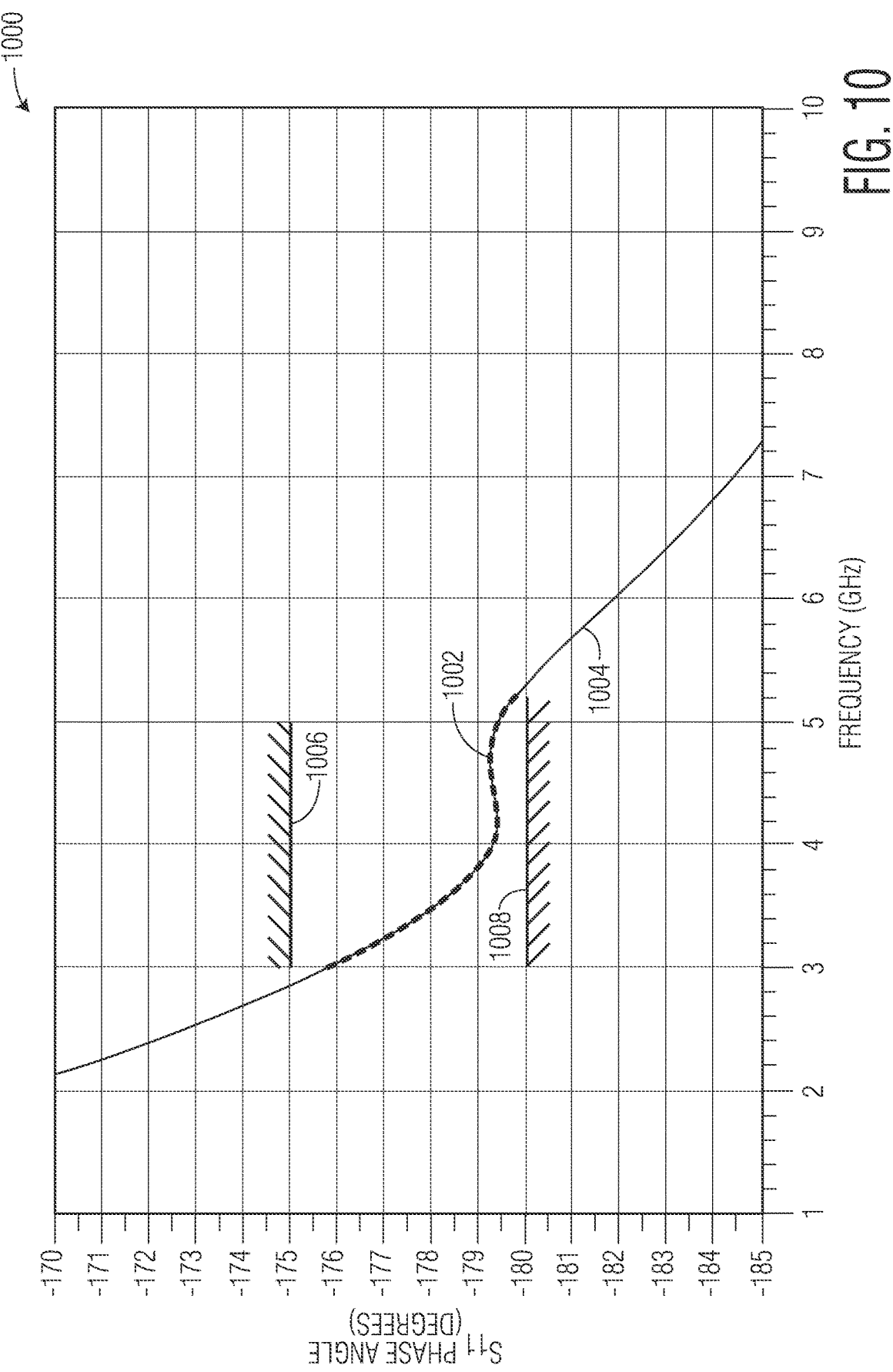
FIG. 10 is a chart showing the input reflection coefficient phase versus frequency for two overlapping frequency bands for a harmonic trap filter having a non-uniform frequency response according to an embodiment.

FIGS. 8-10 show aspects of the input reflection coefficient (i.e., the $S_{11}$ parameter) of a harmonic trap filter (e.g., the harmonic trap filter 400 of FIG. 4) coupled to an input of an RF amplifier over different frequency ranges for a harmonic trap filter having a non-uniform frequency response according to an embodiment. The harmonic trap filter includes an array of eight shunt filter legs (e.g., the shunt filter legs 416 of FIG. 4) configured to have a non-uniform resonance frequency distribution under ideal conditions, with shunt filter legs of the harmonic trap filter that are at or near the center of the array of shunt filter legs having higher resonance frequencies and shunt filter legs at or near the edges of the array of shunt filter legs having lower resonance frequencies (e.g., as described above in connection with at least the harmonic trap filter 400 of 4). The harmonic trap filter includes an array of eight shunt filter legs having the following distribution of resonance frequencies under ideal conditions: [0.46*Fr, 0.82*Fr, Fr, Fr, Fr, Fr, 0.82*Fr, 0.46*Fr], where Fr represents twice the center frequency of the fundamental frequency band of the amplifier. In the present example, Fr is around 5.033 GHz. Dampening resistors (e.g., dampening resistors 334, 410 of FIGS. 3, 4) are coupled between adjacent shunt filter legs of the harmonic trap filter, which may make the harmonic trap filter more tolerant to variation in bond-wire shape. The charts of FIGS. 8-10, in representing respective characteristics of the harmonic trap filter, take into account non-idealities, such as the mutual inductance between bond-wires and non-idealities (e.g., shape variation) in bond-wires of the harmonic trap filter. As will be described, despite these non-idealities, the RF amplifier that includes the harmonic trap filter may still operate within acceptable thresholds over a relatively wide frequency band (e.g., wider than the operating frequency band of the RF amplifier of the example of FIGS. 5-7) due, at least in part, to the distribution of resonance frequencies of the shunt filter legs of the harmonic trap filter and the inclusion of the dampening resistors between the shunt filter legs.

FIG. 8 shows a Smith chart 800 illustrating Sun parameter values of the harmonic trap filter over a first curve 802, corresponding to a first frequency range, and a second curve 804, corresponding to a second frequency range. In the present example, the first frequency range is from 3 GHz to 5.2 GHz and the second frequency range is from 1 GHz to 10 GHz. The first frequency range may correspond to a desired suppression frequency range for the harmonic trap filter, for example. Compared to the first curve 502 of FIG. 5, looping (indicative of parallel resonances between shunt filter legs) is mitigated in the first curve 802 due, at least in part, to the inclusion of dampening resistors between shunt filter legs of the harmonic trap filter of the present example.

For operation of some RF amplifiers, such as Class F power amplifiers, it is desirable for the input harmonic trap filter to provide a low impedance (at or near short) termination for one or more harmonics (e.g., the second harmonic) of the carrier frequency. Further, for operation of some RF amplifiers, such as Class F power amplifiers, it is undesirable for the $S_{11}$ parameters of the second harmonics of the carrier frequency to be in the inductive region (e.g., upper half) of the Smith chart. While not a perfect short, the $S_{11}$ parameters of the harmonic trap filter of the present example across the first frequency range, as shown via the first curve 802, are relatively closer to short compared to those of the first curve 502 of FIG. 5. Additionally, the $S_{11}$ parameters of the harmonic trap filter of the present example across the first frequency range, as shown in the via the first curve 802, are all in the capacitive region (lower half) of the Smith chart, with none falling within the inductive region of the Smith chart. This is in contrast with the first curve 502 of FIG. 5 and its corresponding harmonic trap filter, in which $S_{11}$ parameters for some frequencies of the first frequency range are in the inductive region. Thus, the configuration of the present harmonic trap filter (having a non-uniform distribution of resonance frequencies and dampening resistors between shunt filter legs) may provide improved RF amplifier performance for some types of RF amplifiers, such as Class F power amplifiers.

FIG. 9 shows a chart 900 illustrating $S_{11}$ parameter magnitude versus frequency over the first and second frequency ranges corresponding to the Smith chart 800 of FIG. 8. A first curve 902 corresponds to the first frequency range (3 GHz to 5.2 GHz) and a second curve 904 corresponds to the second frequency range (1 GHz to 10 GHz). A magnitude threshold 906 (corresponding to a $S_{11}$ magnitude of 0.90) is shown, under which the magnitude of the Sn parameter may be undesirable. For purposes of comparison, the magnitude threshold 906 is the same as the magnitude threshold 606 of FIG. 6. As shown by both the first curve 902 and the second curve 904, despite mutual inductance between bond-wires of the harmonic trap filter and non-idealities due to varying bond-wire shape, the present harmonic trap filter maintains $S_{11}$ parameter magnitudes over the magnitude threshold 906 across both the first and second frequency ranges. This is due, at least in part, to the non-uniform distribution of resonance frequencies of the array of shunt filter legs of the harmonic trap filter and the inclusion of dampening resistors between adjacent shunt filter legs of the harmonic trap filter.

FIG. 10 shows a chart 1000 illustrating $S_{11}$ parameter phase angle versus frequency over the first and second frequency ranges corresponding to the Smith chart 800 of FIG. 8. A first curve 1002 corresponds to the first frequency range (3 GHz to 5.2 GHz) and a second curve 1004 corresponds to the second frequency range (1 GHz to 10 GHz, though some of these frequencies fall outside of the range of phase angles shown in the present example). A first phase angle threshold 1006 (around −175 degrees) and a second phase angle threshold 1008 (around −180 degrees) are shown, corresponding, respectively, to upper and lower phase angle thresholds. For purposes of comparison, the first phase angle threshold 1006 and the second phase angle threshold 1008 are respectively the same as the first phase angle threshold 706 and the second phase angle threshold 708 of FIG. 7. As shown via the first and second curves 1002 and 1004, the Sn parameter phase angles across the entire first frequency range and portions of the second frequency range fall between the first and second phase angle thresholds 1006 and 1008. For example, a relatively larger bandwidth (around 2.6 GHz) between 2.8 GHz and 5.4 GHz is suppressed by the harmonic trap filter of the present example, which exceeds the 1 GHz suppression bandwidth provided by the harmonic trap filter represented in FIG. 7 (having a uniform resonance frequency distribution and no dampening resistors).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one embodiment has been presented in the foregoing detailed description, it should be appreciated numerous acceptable variations are possible. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. An amplifier package comprising:
a harmonic trap filter that includes an array of shunt filter legs, wherein a first set of shunt filter legs of the array of shunt filter legs near edges of the array of shunt filter legs have first resonance frequencies that are lower than second resonance frequencies of a second set of shunt filter legs of the array of shunt filter legs near a center of the array of shunt filter legs; and
a transistor die coupled to the harmonic trap filter, the transistor die comprising at least one transistor, wherein the array of shunt filter legs comprises:
a plurality of inductors, each having similar inductance values; and
a plurality of capacitors, wherein a first set of capacitors of the plurality of capacitors has first capacitance values that are greater than capacitance values of a second set of capacitors of the plurality of capacitors, wherein the first set of capacitors is disposed near the edges of the array of shunt filter legs and the second set of capacitors is disposed near the center of the array of shunt filter legs.

2. The amplifier package of claim 1, wherein each shunt filter leg of the array of shunt filter legs comprises:
an inductor;
a capacitor coupled in series with the inductor; and
an intermediate node coupled between the inductor and the capacitor.

3. The amplifier package of claim 2, wherein each shunt filter leg of the array of shunt filter legs is coupled between a respective input node of a plurality of input nodes and a ground potential node, and the plurality of input nodes is coupled to the transistor die.

4. The amplifier package of claim 3, further comprising:
a second plurality of resistors, wherein each of the second plurality of resistors is coupled between a respective pair of adjacent input nodes of the plurality of input nodes.

5. The amplifier package of claim 2, further comprising:
a first plurality of resistors, wherein each of the first plurality of resistors is coupled between a respective pair of intermediate nodes of adjacent shunt filter legs of the array of shunt filter legs.

6. A harmonic trap filter comprising:
an array of series LC filters arranged in parallel between a plurality of input nodes and a ground potential node, wherein a first set of series LC filters of the array of series LC filters near edges of the array of series LC filters has first resonance frequencies that are lower than a second set of series LC filters of the array of series LC filters near a center of the array of series LC filters; and
odd-mode resistors, wherein each of the odd-mode resistors is coupled between adjacent input nodes of the plurality of input nodes.

7. The harmonic trap filter of claim 6, further comprising:
dampening resistors, wherein each of the dampening resistors is coupled between intermediate nodes of adjacent series LC filters of the array of series LC filters, and each of the intermediate nodes is coupled between a capacitor and an inductor of a corresponding series LC filter of the array of series LC filters.

8. The harmonic trap filter of claim 6, wherein the array of series LC filters comprises:
a plurality of inductors, each having similar inductance values; and
a plurality of capacitors, wherein a first set of capacitors of the plurality of capacitors has first capacitance values that are greater than capacitance values of a second set of capacitors of the plurality of capacitors, wherein the first set of capacitors is disposed near the edges of the array of series LC filters and the second set of capacitors is disposed near the center of the array of series LC filters.

9. The harmonic trap filter of claim 6, wherein the array of series LC filters comprises:
a plurality of capacitors, each having similar capacitance values; and
a plurality of inductors, wherein a first set of inductors of the plurality of inductors has first inductance values that are greater than inductance values of a second set of inductors of the plurality of inductors, wherein the first set of inductors is disposed near the edges of the array of series LC filters and the second set of inductors is disposed near the center of the array of series LC filters.

10. A radio frequency (RF) amplifier comprising:

a transistor die comprising at least one transistor device having a control terminal; and an input harmonic trap filter coupled to the control terminal of the at least one transistor device, wherein the input harmonic trap filter includes an array of shunt filter legs having a non-uniform resonance frequency distribution that includes first shunt filter legs with lower resonance frequencies near edges of the array of shunt filter legs and second shunt filter legs with higher resonance frequencies near the center of the array of shunt filter legs, wherein the array of shunt filter legs comprises:

a plurality of capacitors, each having similar capacitance values; and a plurality of inductors, wherein a first set of inductors of the plurality of inductors has first inductance values that are greater than inductance values of a second set of inductors of the plurality of inductors, wherein the first set of inductors is disposed near the edges of the array of shunt filter legs and the second set of inductors is disposed near the center of the array of shunt filter legs.

11. The RF amplifier of claim 10, wherein each shunt filter leg of the array of shunt filter legs comprises:

an inductor;

a capacitor coupled in series with the inductor; and an intermediate node coupled between the inductor and the capacitor.

12. The RF amplifier of claim 11, wherein the input harmonic trap filter comprises a plurality of input nodes and the array of shunt filter legs is coupled between the plurality of input nodes and a ground potential node.

13. The RF amplifier of claim 12, wherein the input harmonic trap filter comprises:

a plurality of dampening resistors coupled between intermediate nodes of adjacent shunt filter legs of the array of shunt filter legs.

14. The RF amplifier of claim 12, wherein the input harmonic trap filter comprises:

a plurality of odd-mode resistors coupled between adjacent input nodes of the plurality of input nodes, wherein the plurality of odd-mode resistors is configured to suppress odd-mode oscillations of the RF amplifier.

15. The RF amplifier of claim 10, further comprising:

an output harmonic trap filter coupled to an output of the at least one transistor device, the output harmonic trap filter having a non-uniform resonance frequency distribution.

* * * * *